US012625439B2

(12) United States Patent
Jang

(10) Patent No.: US 12,625,439 B2
(45) Date of Patent: May 12, 2026

(54) SUBSTRATE TREATING METHOD AND SUBSTRATE TREATING APPARATUS

(71) Applicant: SEMES CO., LTD., Cheonan-si (KR)

(72) Inventor: Ho Jin Jang, Cheonan-si (KR)

(73) Assignee: Semes Co., LTD., Cheonan-si (KR)

( * ) Notice: Subject to any disclaimer, the term of this patent is extended or adjusted under 35 U.S.C. 154(b) by 209 days.

(21) Appl. No.: 18/340,535

(22) Filed: Jun. 23, 2023

(65) Prior Publication Data

US 2024/0219828 A1 Jul. 4, 2024

(30) Foreign Application Priority Data

Dec. 29, 2022 (KR) ........................ 10-2022-0189582

(51) Int. Cl.
*G03F 7/00* (2006.01)
(52) U.S. Cl.
CPC ................................. *G03F 7/70866* (2013.01)
(58) Field of Classification Search
None
See application file for complete search history.

(56) References Cited

U.S. PATENT DOCUMENTS

2009/0311419 A1* 12/2009 Foerster ............ H01L 21/67051
118/57
2016/0096203 A1* 4/2016 Kai ................... H01L 21/31133
134/30

FOREIGN PATENT DOCUMENTS

| JP | 1990129643 A | 5/1990 |
| JP | 2002131929 A | 5/2002 |
| JP | 5225880 B2 | 7/2013 |
| KR | 10-0262902 | 9/2000 |

OTHER PUBLICATIONS

Korean Office Action issued Mar. 11, 2025 in Korean Patent Application No. 10-2022-0189582.

* cited by examiner

*Primary Examiner* — Michael P. Rodriguez
(74) *Attorney, Agent, or Firm* — Harness, Dickey & Pierce, P.L.C.

(57) ABSTRACT

The inventive concept provides a substrate treating method on which there is no generation of a portion on which a development is not performed, among a front surface of a substrate during a puddle process. The substrate treating method includes positioning a substrate in a treating space; forming a liquid film of a treating liquid on the substrate by supplying the treating liquid to a rotating substrate; and puddling including stopping the supplying of the treating liquid and reacting a thin film on the substrate with the liquid film on the substrate, and wherein an exhaust pressure provided at the treating space during the puddling is lower than an exhaust pressure provided at the treating space during the forming of the liquid film.

15 Claims, 8 Drawing Sheets

Figure 8:
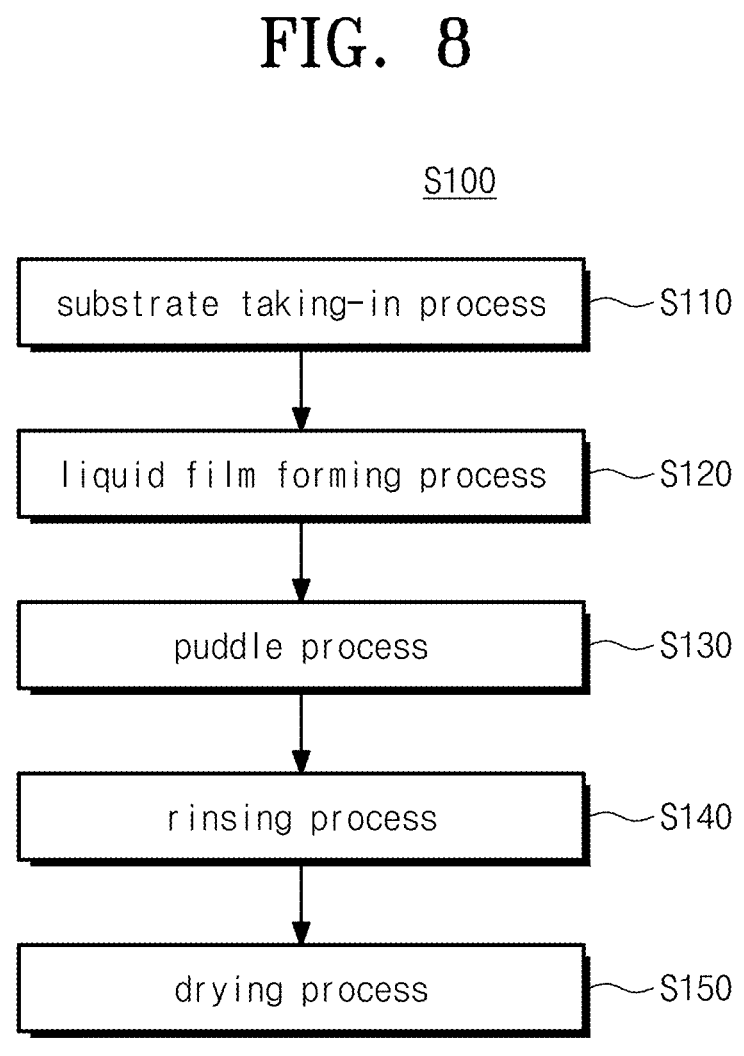

| substrate taking-in process | ~S110 |

$\downarrow$

| liquid film forming process | ~S120 |

$\downarrow$

| puddle process | ~S130 |

$\downarrow$

| rinsing process | ~S140 |

$\downarrow$

| drying process | ~S150 |

SUBSTRATE TREATING METHOD AND SUBSTRATE TREATING APPARATUS

CROSS-REFERENCE TO RELATED APPLICATIONS

A claim for priority under 35 U.S.C. § 119 is made to Korean Patent Application No. 10-2022-0189582 filed on Dec. 29, 2022, in the Korean Intellectual Property Office, the entire contents of which are hereby incorporated by reference.

TECHNICAL FIELD

Embodiments of the inventive concept described herein relate to a substrate treating method and a substrate treating apparatus.

BACKGROUND

Conventionally, a substrate treating apparatus used in a semiconductor process includes a liquid treating chamber which performs a liquid treatment (e.g., photoresist liquid coating, an anti-reflection layer coating, a developing liquid coating, etc.) on a substrate.

Korean Patent Registration Publication No. 10-0386712 (published on Aug. 20, 2001) contains an embodiment of a substrate development treating method. Referring to the above publication, a conventional substrate development treatment method includes a coating process of coating a developing liquid on the substrate to form a liquid film, a puddle process of reacting a thin film on the substrate with the liquid film of the developing liquid, and a rinsing process of supplying a rinsing liquid on the substrate.

Meanwhile, conventionally, during the above processes, a treating space at which the substrate is positioned was continuously exhausted for a purpose of fume removal and the like, and therefore, there occurred a problem in which a front surface of the substrate was not wetted during the puddle process and an empty space (=on which a development did not occur) occurred locally.

SUMMARY

Embodiments of the inventive concept provide a substrate treating method on which a portion on which a development is not performed is not generated, among a front surface of a substrate during a puddle process.

The technical objectives of the inventive concept are not limited to the above-mentioned ones, and the other unmentioned technical objects will become apparent to those skilled in the art from the following description.

The inventive concept provides a substrate treating method. The substrate treating method includes a positioning a substrate in a treating space; forming a liquid film of a treating liquid on the substrate by supplying the treating liquid to a rotating substrate; and puddling including stopping the supplying of the treating liquid and reacting a thin film on the substrate with the liquid film on the substrate, and wherein an exhaust pressure provided at the treating space during the puddling is lower than an exhaust pressure provided at the treating space during the forming of the liquid film.

In an embodiment, the exhaust pressure provided at the treating space during the puddling is zero.

In an embodiment, the substrate treating method further including: rinsing including supplying a rinsing liquid to the substrate which has been subject to the puddling and wherein an exhaust pressure provided at the treating space during the rising is higher than the exhaust pressure provided at the treating space during the puddling.

In an embodiment, the supplying of the treating liquid to the rotating substrate in the forming of the liquid film includes supplying the treating liquid to the substrate while changing supply position from an edge region of the substrate to a central region.

In an embodiment, the forming of the liquid film and the puddling are repeated N (N≥2) times.

In an embodiment, N is in the range of 2≤N≤5.

In an embodiment, the treating liquid is provided as a developing liquid.

In an embodiment, the rinsing liquid is provided as a pure water.

In an embodiment, the substrate treating method further includes: drying the substrate which has been subjected to the rinsing.

In an embodiment, the substrate rotates at a speed of about 30 rpm or less in the forming of the liquid film.

In an embodiment, the substrate rotates at a speed of about 30 rpm or less or does not rotate in the puddling.

The inventive concept provides a substrate treating apparatus. The substrate treating apparatus includes a housing; a cup disposed within the housing and providing a treating space; a support plate disposed within the treating space and supporting and rotating the substrate; a first nozzle for spraying a treating liquid to a substrate mounted on the support plate; an exhaust pipe for exhausting an inside of the cup; a pump coupled to the exhaust pipe; a valve for opening and closing the exhaust pipe; and a controller configured to control the support plate, the first nozzle, the pump, and the valve, and wherein the controller controls so an exhaust pressure provided at the treating space while a liquid layer of the treating liquid supplied to the substrate reacts with a thin film of the substrate, is lower than an exhaust pressure provided at the treating space while the treating liquid is supplied to the substrate.

In an embodiment, the controller controls the exhaust pressure provided at the treating space while the liquid layer of the treating liquid supplied to the substrate reacts with the thin film of the substrate to be zero.

In an embodiment, the treating liquid is provided as a developing liquid.

In an embodiment, the substrate treating apparatus further includes a second nozzle spraying a rinsing liquid to the substrate mounted on the support plate.

In an embodiment, the rinsing liquid is a pure water.

In an embodiment, the substrate treating apparatus further includes a liquid drain pipe for draining a liquid from inside of the cup.

The inventive concept provides a substrate treating method. The substrate treating method includes a positioning a substrate in a treating space; forming a liquid film of a developing liquid on the substrate by supplying the developing liquid to a rotating substrate; and puddling including stopping the supplying of the developing liquid and reacting a thin film on the substrate with the liquid film of the developing liquid, and wherein an exhaust pressure provided at the treating space during the puddling is lower than an exhaust pressure provided at the treating space during the forming of the liquid film, and the forming of the liquid film and the puddling are repeated three times.

In an embodiment, the exhaust pressure provided at the treating space during puddling is zero.

In an embodiment, the substrate treating apparatus further includes: rising including supplying a rinsing liquid to the substrate which has been subject to the puddling, and wherein an exhaust pressure provided at the treating space during the rising is higher than the exhaust pressure provided at the treating space during puddling.

According to an embodiment of the inventive concept, a problem on which an edge of a substrate is locally not developed, during a puddle process, after a liquid film forming process on a substrate is resolved.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 8 illustrates a flow chart of a substrate treating method according to an embodiment.

Figure 1:
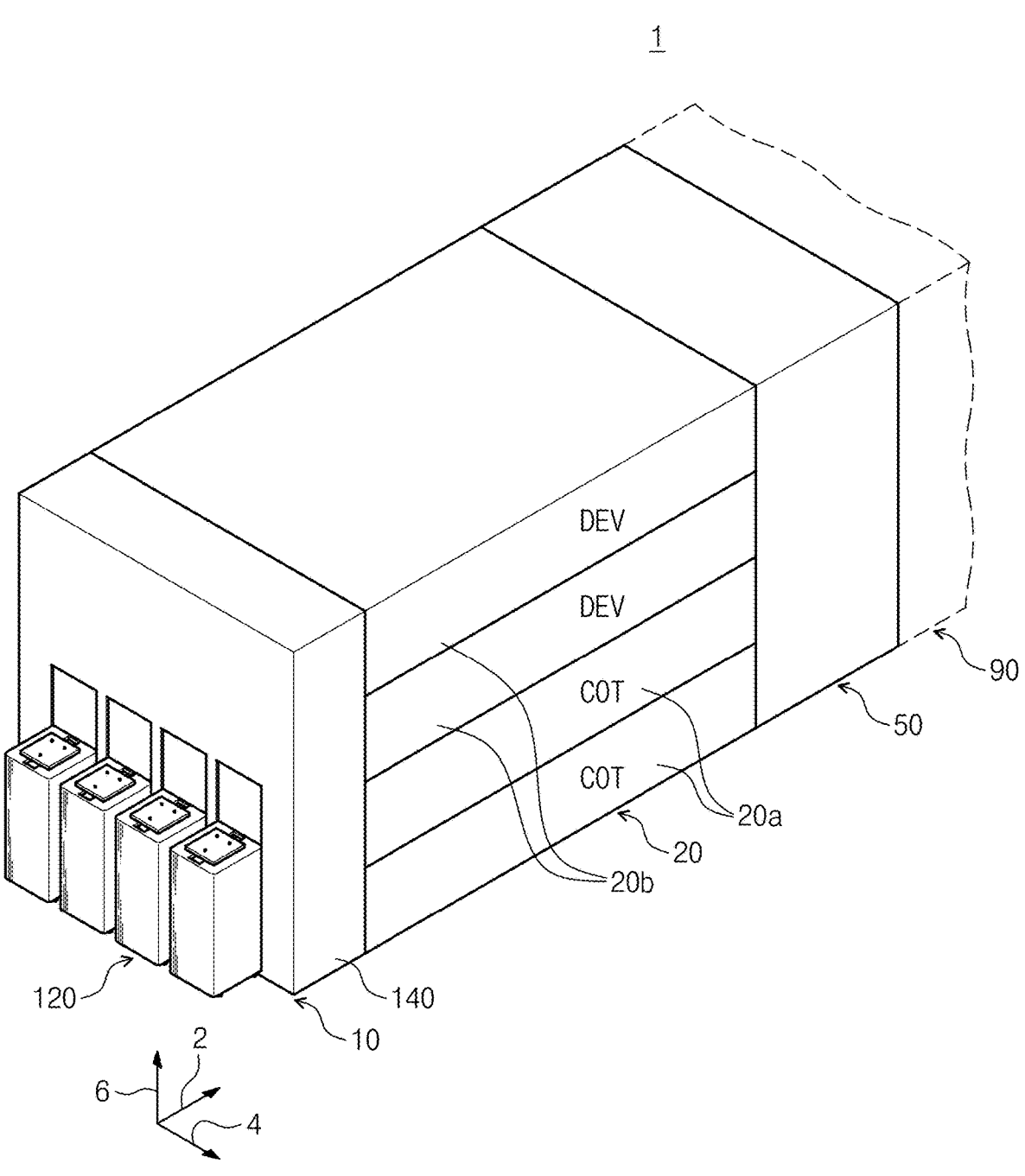
FIG. 1 illustrates a perspective view of a substrate treating apparatus according to an embodiment.

Various features and advantages of a non-limiting embodiment of the inventive concept may be more apparent by reviewing the detailed description together with the accompanying views. The accompanying views are provided for illustrative purposes only and should not be construed as limiting the scope of claims. The accompanying views shall not be considered to be drawn to scale unless explicitly stated. For clarity, various dimensions of the views may have been exaggerated.

DETAILED DESCRIPTION

Example embodiments will now be described more fully with reference to the accompanying drawings. Example embodiments are provided so that this disclosure will be thorough and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

When the term "same" or "identical" is used in the description of example embodiments, it should be understood that some imprecisions may exist. Thus, when one element or value is referred to as being the same as another element or value, it should be understood that the element or value is the same as the other element or value within a manufacturing or operational tolerance range (e.g., ±10%).

When the terms "about" or "substantially" are used in connection with a numerical value, it should be understood that the associated numerical value includes a manufacturing or operational tolerance (e.g., ±10%) around the stated numerical value. Moreover, when the words "generally" and "substantially" are used in connection with a geometric shape, it should be understood that the precision of the geometric shape is not required but that latitude for the shape is within the scope of the disclosure.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Hereinafter, a substrate treating apparatus according to an embodiment and a transfer hand according to an embodiment will be described in detail with reference to the accompanying drawings.

Figure 2:
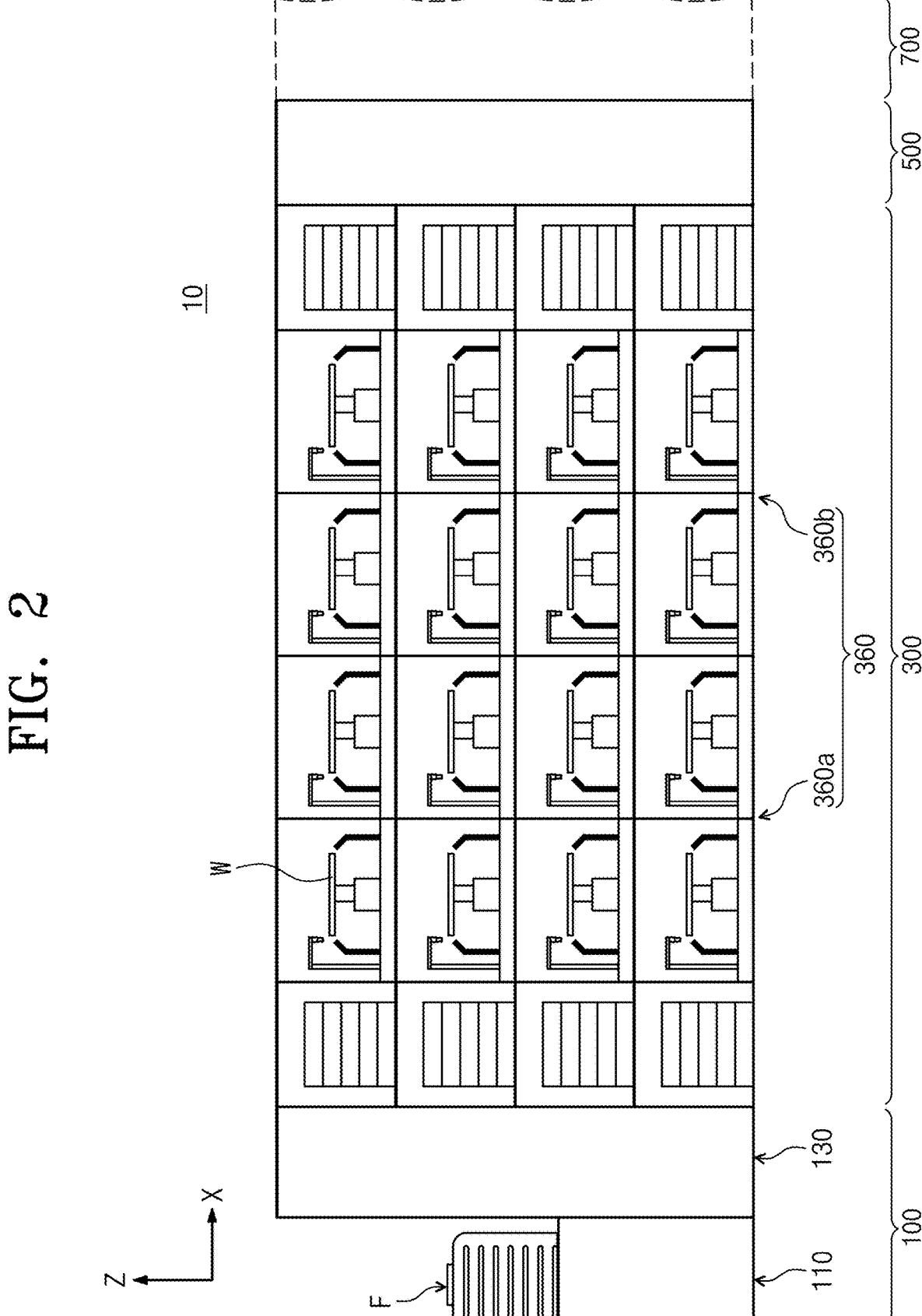
FIG. 2 illustrates a side cross-sectional view of the substrate treating apparatus according to an embodiment.
Figure 3:
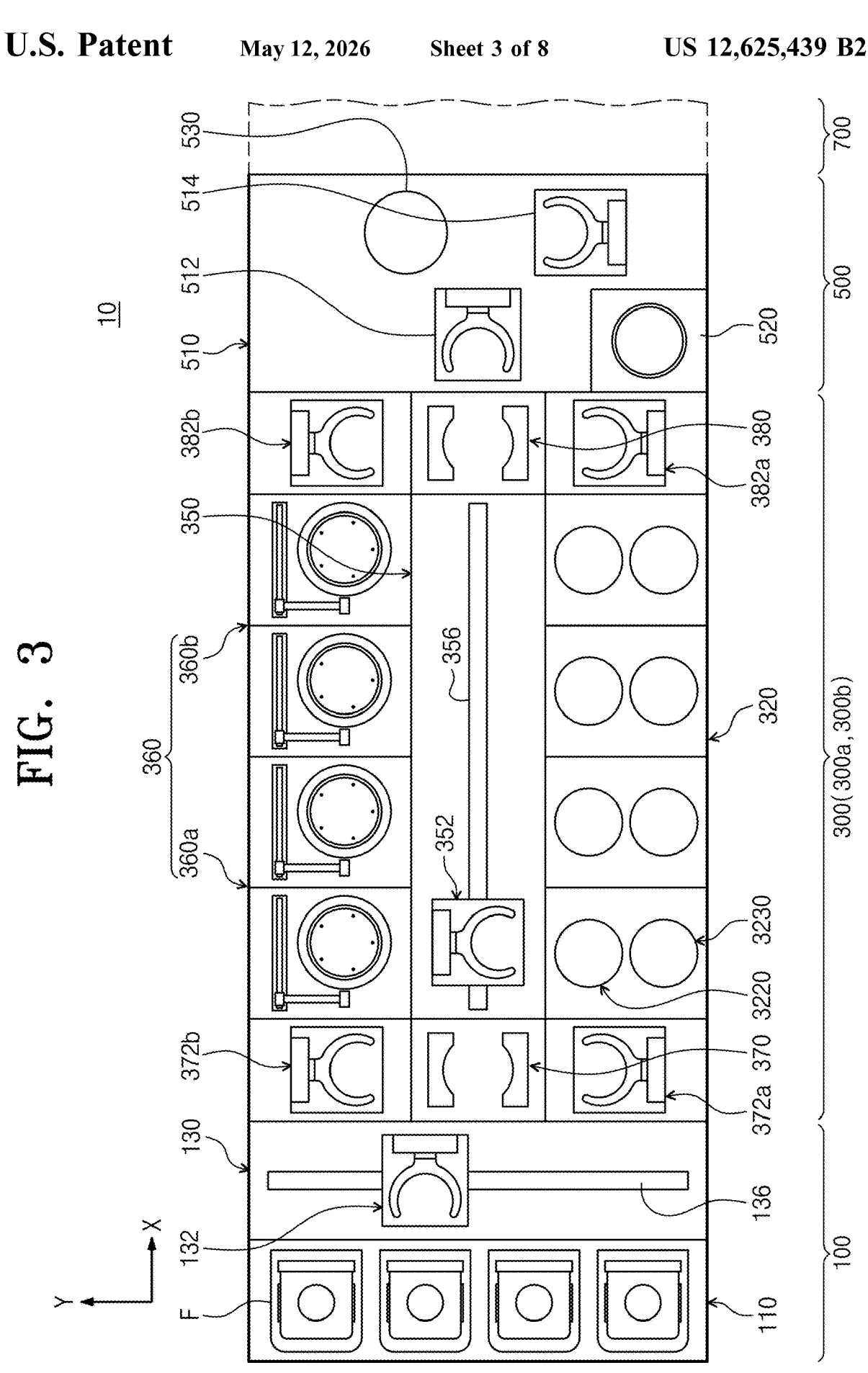
FIG. 3 illustrates a plan view of the substrate treating apparatus according to an embodiment.

FIG. 1 shows a perspective view of a substrate treating apparatus 10 according to an embodiment, FIG. 2 shows a side cross-sectional view of the substrate treating apparatus 10, and FIG. 3 shows a plan view of the substrate treating apparatus 10.

A three-dimensional coordinate system used in the description is based on an index module 100 shown in FIG. 1, defines a width direction of the index module 100 as an X-axis direction, defines a length direction of the index module 100 as a Y-axis direction, and defines a height direction of the index module 100 as a Z-axis direction.

As shown in FIG. 1 to FIG. 3, the substrate treating apparatus 10 includes an index module 100 and a treating module. In some embodiments, the substrate treating apparatus 10 may further include an interface module 500.

The index module 100, the treating module 300, and the interface module 500 may be sequentially disposed along the X-axis direction.

The index module 100 unloads the substrate W from a container F in which the substrate W is stored, transfers it to the treating module 300, and loads a substrate W which has been treated to the container F.

The index module 100 may include a load port 110 and an index frame 130. The index frame 130 is adjacent to the treating module 300, and the load port 110 is positioned on the opposite side of the treating module 300 based on the index frame 130.

The container F is placed in the load port 110. The container F may be a front open unified pod (FOUP).

The container F supplied to the substrate treating apparatus 10 may be placed in the load port 110 by a power transfer means (not shown) such as an overhead transfer, an overhead conveyor, an automatic guided vehicle, or by an operator.

A plurality of load ports 110 may be provided in the index module 100, and in this case, the plurality of load ports 110 may be disposed along the Y-axis direction.

An index robot 132 and a guide rail 136 may be provided within the index frame 130.

The index robot 132 includes a hand holding the substrate W, and transfers the substrate W between the load port 110 and the treating module 300. The guide rail 136 provides a moving path of the index robot 132.

The index robot 132 may be provided with a multi-axis driving mechanism so that various movements may be implemented in the index robot 132. For example, the guide rail 136 may be provided along the Y-axis, the hand may be movable in the X-axis direction and the Z-axis direction, and may be configured to rotate about the Z-axis.

The treating module 300 performs a treating process (e.g., a coating process, a developing process, etc.) on the substrate W supplied from the index module 100. The treating module 300 may include one or both of a coating block 300a for performing a coating process on the substrate W and/or a developing block 300b for performing a developing process on the substrate W.

A plurality of coating blocks 300a may be provided to the treating module 300, and in this case, a plurality of coating blocks 300a may be disposed along the Z-axis direction. A plurality of coating blocks 300a may have the same structure, and may selectively have different structures.

A plurality of developing blocks 300b may be provided to the treating module 300, and in this case, the plurality of developing blocks 300b may be disposed along the Z-axis direction. The plurality of developing blocks 300b may have the same structure, and may selectively have different structures.

The number of the coating block 300a and the developing block 300b is not limited. For example, as shown in the view, two coating blocks 300a and two developing blocks 300b may be provided, and a group consisting of two coating blocks 300a may be disposed under a group consisting of two developing blocks 300b.

The coating block 300a [or developing block 300b] may include a heat treatment chamber 320, a transfer chamber 350, a liquid treatment chamber 360, a first buffer chamber 370 and a second buffer chamber 380.

The heat treatment chamber 320, the transfer chamber 350, and the liquid treatment chamber 360 may be sequentially disposed along the Y-axis direction.

The heat treatment chamber 320 performs a heat treatment (e.g., a cooling, a heating, etc.) on the substrate W. The heat treatment chamber 320 may include one or both of a cooling unit 3220 for cooling the substrate W and a heating unit 3230 for heating the substrate W.

A plurality of heat treatment chambers 320 may be provided at the coating block 300a [or the developing block 300b], and in this case, the plurality of heat treatment chambers 320 may be disposed in a matrix structure on an XZ plane.

The transfer chamber 350 transfers the coating block 300a [or the developing block 300b] between the heat treatment chamber 320 and the liquid treatment chamber 360.

A transfer robot 352 and a guide rail 356 may be provided within the transfer chamber 350.

The transfer robot 352 includes a hand holding the substrate W, and transfers the substrate W between the heat treatment chamber 320 and the liquid treatment chamber 360. The guide rail 356 provides a moving path of the transfer robot 352.

A multi-axis driving mechanism may be provided to the transfer robot 352 to implement various movements to the transfer robot 352. For example, the guide rail 356 may be provided along the X-axis, the hand may be movable in the Y-axis and the Z-axis directions, and may be configured to rotate about the Z-axis.

The liquid treatment chamber 360 performs a liquid treatment on the substrate W (e.g., a photoresist coating, an anti-reflection coating, a developing liquid coating, etc.).

A plurality of liquid treatment chambers 360 may be provided on the coating block 300a [or the developing block 300*b*], and in this case, the plurality of liquid treatment chambers 360 may be disposed in a matrix structure on an XZ plane.

Meanwhile, if the plurality of liquid treatment chambers 360 are provided in the coating block 300*a*, those relatively adjacent to the index module 100 are referred to as front liquid treatment chambers 360*a*, and those relatively adjacent to the interface module 500 are referred to as rear treatment chambers 360R.

The front liquid treatment chamber 360*a* may provide a first liquid on the substrate W, the rear liquid treatment chamber 360*b* may provide a second liquid on the substrate W, and the first liquid and the second liquid may be of different types. For example, the first liquid may be an antireflective film, and the second liquid may be a photoresist liquid.

In some configurations, the first liquid may be a photoresist liquid and the second liquid may be an antireflection film.

In some embodiments, the first liquid and the second liquid may be of the same type.

Meanwhile, if the plurality of liquid treatment chambers 360 are provided to the developing block 300*b*, most of the plurality of liquid treatment chambers 360 provided to the developing block 300*b* may be configured to develop the substrate W using a developing liquid.

A first buffer chamber 370 may be disposed between the index module 100 and the transfer chamber 350. A plurality of first buffer chambers 370 may be provided in the coating block 300*a* [or developing block 300*b*], and in this case, the plurality of first buffer chambers 370 may be disposed along the Z-axis.

Near the plurality of first buffer chambers 370, first buffer robots 372*a*, 372*b* for transferring the substrate W between the plurality of first buffer chambers 370 may be provided.

A second buffer chamber 380 may be disposed between the transfer chamber 350 and the interface module 500. A plurality of second buffer chambers 380 may be provided in the coating block 300*a* [or developing block 300*b*], and in this case, the plurality of second buffer chambers 380 may be disposed along the Z-axis.

Near the plurality of second buffer chambers 380, second buffer robots 382*a*, 382*b* for transferring the substrate W between the plurality of second buffer chambers 380 may be provided.

Each of the first buffer robots 372*a* and 372*b* and the second buffer robots 382*a* and 382*b* includes a hand for holding the substrate W.

A multi-axis driving mechanism may be provided at each of the first buffer robots 372*a* and 372*b* and the second buffer robots 382*a* and 382*b* so that various movements are implemented for each of the first buffer robots 372*a* and 372*b* and the second buffer robots 382*a* and 382*b*.

The first buffer chamber 370 and the second buffer chamber 380 temporarily store the substrate W. The substrate W may be taken into or taken out of the first buffer chamber 370 by the index robot 132 and the transfer robot 352. The substrate W may be taken into or taken out of the second buffer chamber 380 by the transfer robot 352 and a first interface robot 512 to be described later.

The interface module 500 connects the treating module 300 with another outer apparatus (e.g., an exposure apparatus 700, etc.). The interface module 500 may include an interface frame 510, an additional process chamber 520, and a buffer zone 530.

The interface frame 510 has a predetermined volume. A first interface robot 512 and a second interface robot 514 may be provided within the interface frame 510.

Each of the first interface robot 512 and the second interface robot 514 include a hand for holding the substrate W.

A multi-axis driving mechanism may be provided for each of the first interface robot 512 and the second interface robot 514 so that various movements are implemented for each of the first interface robot 512 and the second interface robot 514.

The first interface robot 512 may be configured to transfer the substrate W between the treating module 300, the additional process chamber 520, and the buffer zone 530, and the second interface robot 514 may be configured to transfer the substrate W between the buffer zone 530 and other outer apparatuses (e.g., an exposure apparatus 700).

The additional process chamber 520 and the buffer zone 530 are provided within the interface frame 510.

The additional process chamber 520 performs an additional process on the substrate W which has been treated in the treating module 300 [coating block 300*a*]. An example of the additional process include an edge exposure process for exposing an edge region of the substrate W, a top surface cleaning process for cleaning a top surface of the substrate W, and a bottom surface cleaning process for cleaning a bottom surface of the substrate W.

The buffer zone 530 temporarily stores the substrate W transferred between the treating module 300, the additional process chamber 520 and other outer apparatuses (e.g., exposure apparatus 700, etc.).

Figure 4:
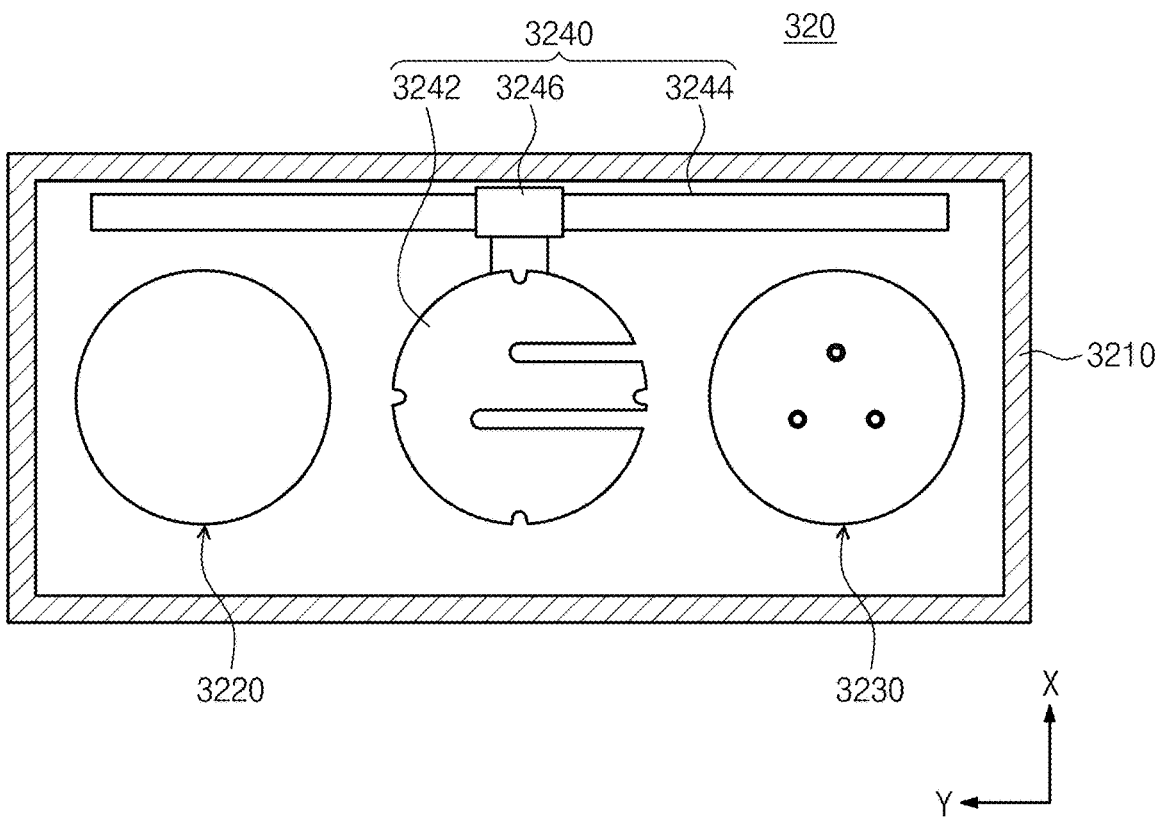
FIG. 4 illustrates a plan view of a heat treatment chamber of FIG. 3.
Figure 5:
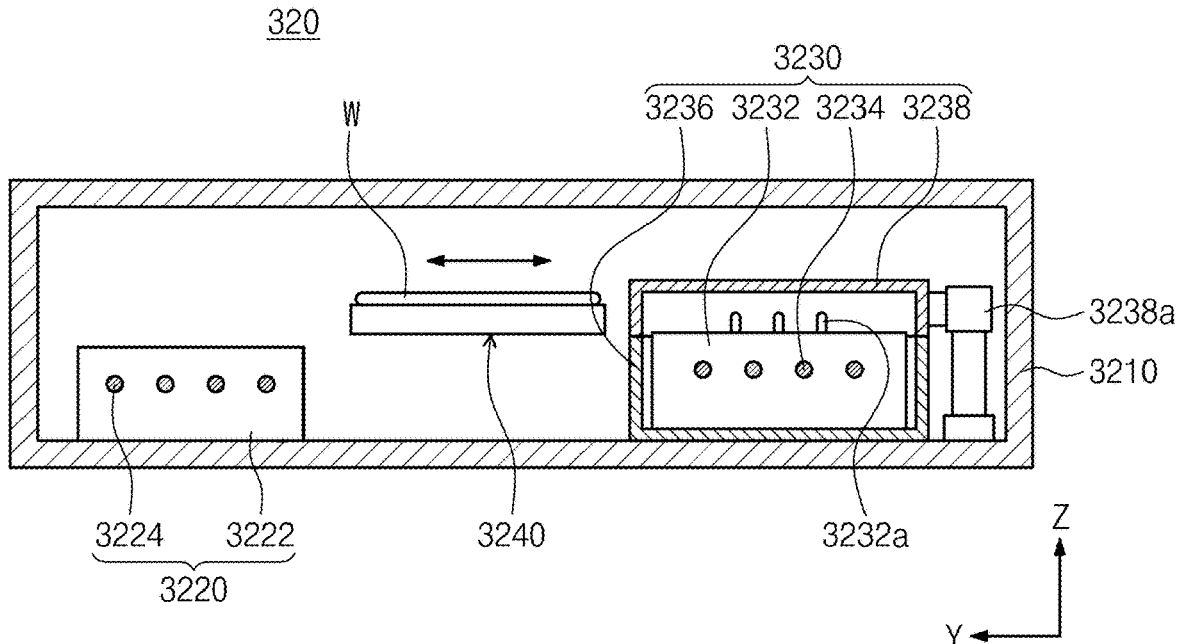
FIG. 5 illustrates a front end view of the heat treatment chamber of FIG. 3.

FIG. 4 shows a plan view of a heat treatment chamber 320 of FIG. 3, and FIG. 5 shows a front end view of the heat treatment chamber 320 of FIG. 3.

As shown in FIG. 4 and FIG. 5, the heat treatment chamber 320 may include a housing 3210, a cooling unit 3220, a heating unit 3230, and a transfer unit 3240.

The housing 3210 may be provided in a three-dimensional shape having a predetermined volume. For example, the housing 3210 may be a rectangular parallelepiped. An opening (not shown) for taking in and taking out the substrate W may be formed on a side wall of the housing 3210, and the opening may be opened and closed by a door (not shown).

The cooling unit 3220, the heating unit 3230, and the transfer unit 3240 are provided within the housing 3210. The cooling unit 3220 and the heating unit 3230 may be disposed along the Y-axis.

In some embodiments, the cooling unit 3220 may be positioned closer to the transfer chamber 350 than the heating unit 3230.

The cooling unit 3220 may include a cooling plate 32222 and a cooler 3224. A horizontal cut surface of the cooling plate 3222 may be substantially circular, and a top surface of the cooling plate 3222 may be provided to be flat.

The cooling plate 3222 may be formed of a material having a high thermal conductivity. For example, the cooling plate 3222 may be made of a metal material.

The cooling plate 3222 is generally configured to support the transfer plate 3242 to be described later, but may be selectively configured to directly support the substrate W.

The cooler 3224 is positioned inside the cooling plate 3222 or near the cooling plate 3222 to lower a temperature of the cooling plate 3222. For example, the cooler 3224 may be a fluid channel through which a refrigerant flows.

The heating unit 3230 may include a heating plate 3232 and a heater 3234. A horizontal cut surface of the heating plate 3232 may be substantially circular, and a top surface of the heating plate 3232 may be provided to be flat.

The heating plate 3232 may be formed of a material having a high thermal conductivity. For example, the heating plate 3232 may be made of a metal material.

The heating plate 3232 is configured to directly support the substrate W.

The heater 3234 is positioned inside the heating plate 3232 or near the heating plate 3232 to increase a temperature of the heating plate 3232. For example, the heater 3234 may be a heating resistor.

The heating unit 3230 may further include a lift pin 3232*a* provided within the heating plate 3232 and lifted and lowered in the Z-axis direction. There may be three or more lift pins 3232*a*.

The heating plate 3232 and the heater 3234 may be provided within an enclosure 3236 (closed space). In addition, the enclosure 3236 may include a cover 3238 and the cover 3238 may be configured to be opened and closed by an actuator 3238*a* for taking in and taking out the substrate W.

In some embodiments, a gas which improves a substrate adhesion rate of a photoresist liquid may be additionally supplied within the enclosure 3236. For example, the gas may be a hexamethyldisilane (HMDS).

The transfer unit 3240 is positioned between the cooling unit 3220 and the heating unit 3230, and transfers the substrate W between the cooling unit 3220 and the heating unit 3230.

The transfer unit 3240 may include a cooling unit 3220 and a guide rail 3244 provided parallel to a direction in which the heating unit 3230 is arranged, a guide block 3246 driving along the guide rail 3244, and a transfer plate 324 provided with a side of the guide block 3246.

The transfer plate 3242 may be formed of a material having a high thermal conductivity. For example, the transfer plate 3242 may be made of a metal material.

The transfer plate 3242 may be provided to be directly mounted on the cooling plate 3222 while holding the substrate W. In this case, if the cooler 3224 is operated while the transfer plate 32242 is mounted on the cooling plate 32222, the transfer plate 32242 is also cooled together with the cooling plate 32222.

In some embodiments, the transfer plate 3242 may be configured to cool the substrate W by itself.

The substrate W held by the transfer plate 3242 may be transferred to the heating plate 3232 by the transfer robot 352 described above if the transfer plate 3242 is positioned near the heating plate 3232.

Figure 6:
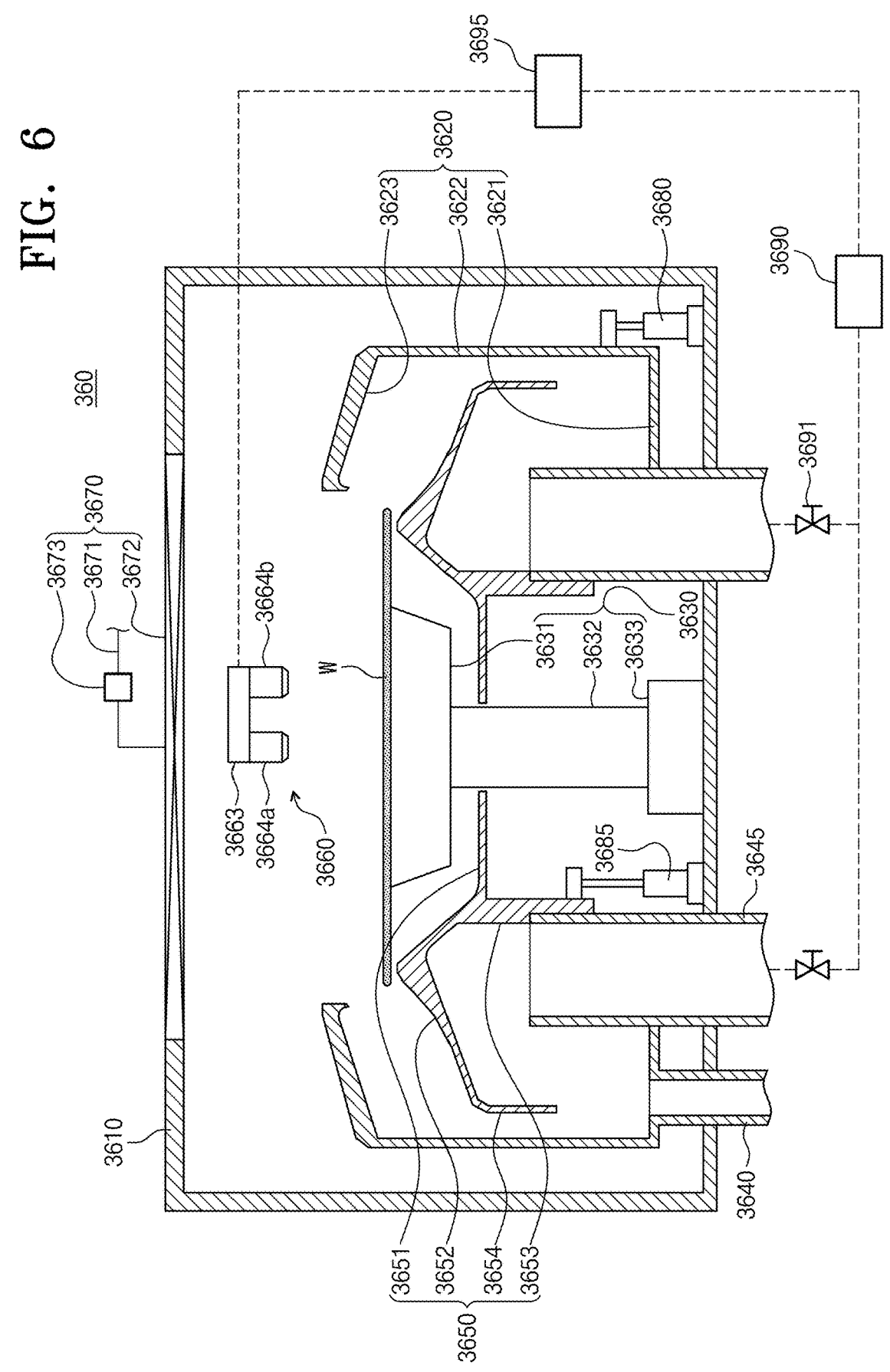
FIG. 6 illustrates a front cross-sectional view of a liquid treatment chamber of FIG. 3.
Figure 7:
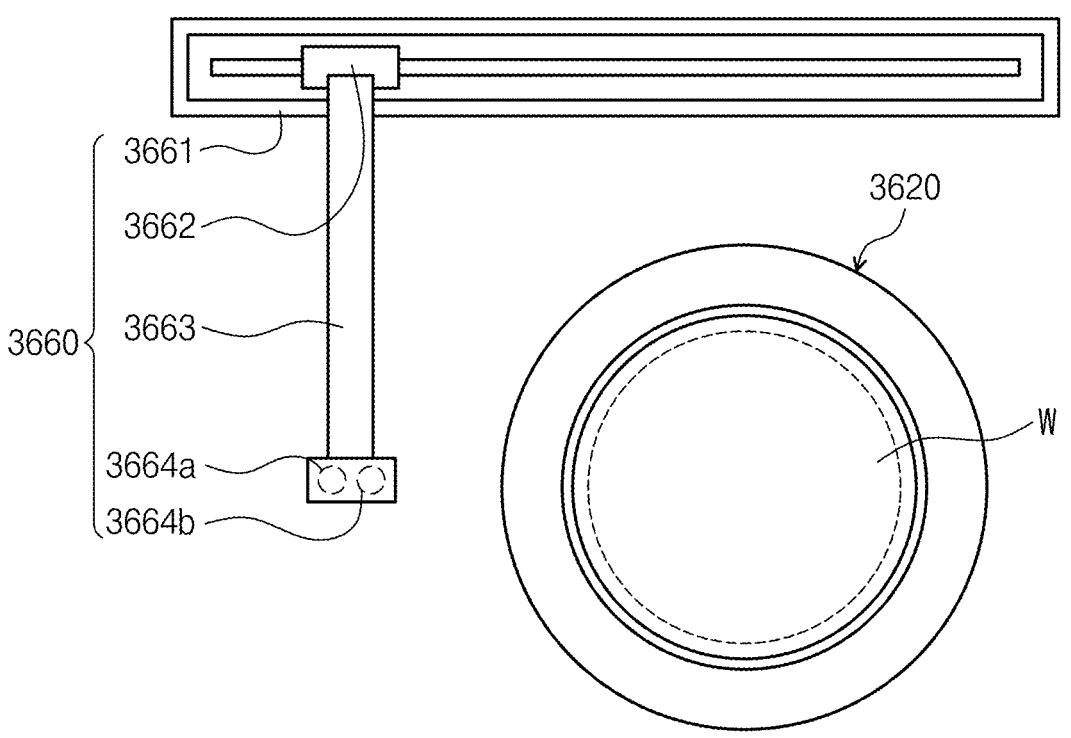
FIG. 7 illustrates a plan view of a liquid injection unit and a cup portion of FIG. 6.

FIG. 6 illustrates a front end plan view of the liquid treatment chamber 360 of FIG. 3, and FIG. 7 illustrates a plan view of portions of a liquid injection unit 3660 and a cup 3620 of FIG. 6.

As illustrated in FIG. 6 to FIG. 7, the liquid treatment chamber 360 includes a housing 3610, a cup 3620, a substrate support unit 3630, a drain pipe 3640, an exhaust pipe 3645, a guide member 3650, a liquid injection unit 3660 and a liquid supply unit (not shown). In some embodiments, the liquid treatment chamber 360 may further include an airflow supply unit 3670, a first actuator 3680, a second actuator 3685 and a controller 3695.

The housing 3610 may be provided in a three-dimensional shape having a predetermined volume. For example, the housing 3610 may be a rectangular parallelepiped. An opening (not shown) for taking in and taking out the substrate W may be formed on a side wall of the housing 3610, and the opening may be opened and closed performed by a door (not shown).

The cup 3620 is provided within the housing 3610. The cup 3620 has a bottom 3621 and a wall 3622 of a predetermined height surrounding the bottom 3621. The wall 3622 provides a treating space (an inner region of the wall 3622) in which the substrate W is treated.

In some embodiments, the cup 3620 may have a roof 3623 formed to be upwardly inclined from a top side of the wall 3622 toward an inner side of the wall 3622. The roof 3623 blocks a liquid and a gas scattered during a substrate treatment process from moving to an outside of the cup 3620.

In some embodiments, an opening for a shaft 3632 and the geared motor 3633 to be described later may be formed at the bottom 3621 of the cup 3620.

The substrate support unit 3630 is provided in the treating space of the cup 3620. The substrate support unit 3630 includes a support plate 3631, a shaft 3632, and a geared motor 3633.

A horizontal cut surface of the support plate 3631 may be substantially circular, and a top surface of the support plate 3631 may be provided to be flat. The support plate 3631 supports a bottom surface of the substrate W. That is, the substrate W is mounted on the top surface of the support plate 3631. The support plate 3631 is configured to be capable of an axial rotation based on an axis passing through a center (hereinafter referred to as a "rotation axis") and rotates the substrate W mounted on the top surface.

The shaft 3632 is provided under the support plate 3631, and is positioned on the rotation shaft. The shaft 3632 may be integrally formed with the support plate 3631, and selectively the support plate 3631 and the shaft 3632 may be formed independently and then combined through a mechanical coupling such as a welding or a bolting.

The geared motor 3633 is positioned near the shaft 3632 and transmits a power to the shaft 3632. It is desirable that the gear motor 3633 is positioned inside the housing 3610, but it is not necessarily positioned within the housing 3610.

An end of the drain pipe 3640 communicates with the treating space of the cup 3620, and the other end thereof is positioned outside the housing 3610. The drain pipe 3640 provides a path through which a liquid scattered during the substrate treatment process may be drained to the outside of the housing 3610.

An end of the exhaust pipe 3645 communicates with the treating space of the cup 3620, and the other end thereof is positioned outside the housing 3610. The exhaust pipe 3645 provides a path through which a gas scattered during the substrate treatment process may be exhausted to the outside of the housing 3610.

A pump for providing an exhaust pressure may be installed at the exhaust pipe 3645.

The exhaust pipe 3645 may be opened and closed by a valve 3691.

An end of the drain pipe 3640 may be provided to be horizontal to the bottom 3621 of the cup 3620. In addition, a predetermined portion of the exhaust pipe 3645 may be positioned within the cup 3620, and the predetermined portion of the exhaust pipe 3645 positioned inside the cup 3620 may be provided perpendicular to the bottom 3621 of the cup 3620. It is preferable that the exhaust pipe 3645 is positioned closer to a rotation axis of the support plate 3631 than the drain pipe 3640, and an end of the exhaust pipe 3645 is positioned at a higher point than an end of the drain pipe 3640.

A plurality of drain pipes 3640 may be provided, and the plurality of drain pipes 3640 may be disposed at regular intervals along a circumference of a rotation axis of the support plate 3631.

A plurality of exhaust pipes 3645 may be provided, and the plurality of exhaust pipes 3645 may be disposed at regular intervals along the circumference of the rotation axis of the support plate 3631.

The guide member 3650 is provided in the treating space of the cup 3620 and is positioned below the substrate W mounted on the support plate 3631. The guide member 3650 separates the liquid and the gas scattered during the substrate treatment process and guides them to the drain pipe 3640 and the exhaust pipe 3645.

The guide member 3650 may include a hub portion 3651, a disk cone portion 3652, a pillar portion 3653, and a ring portion 3654.

The hub portion 3651 may be provided in a shape surrounding a bottom portion of the support plate 3631. For example, the hub portion 3651 may have a bowl shape. An opening for storing the shaft 3632 is formed in a center of the hub portion 3651.

The disk cone portion 3652 is formed radially outward at an edge of the hub portion 3651. That is, an inner edge of the disk cone portion 3652 is connected to an outer edge of the hub portion 3651.

The pillar portion 3653 downwardly extends from a bottom surface of the hub portion 3651. The pillar portion 3653 has a predetermined height and stands in the treating space of the cup 3620. The pillar portion 3653 may be configured to be mounted on the exhaust pipe 3645.

The ring portion 3654 downwardly extends from an outer edge of the disk cone portion 3652. A gap having a predetermined width is provided between the outer surface of the ring portion 3654 and the inner surface of the wall 3622.

A liquid and gas scattered during the substrate treating process of the disk cone portion 3652 move to the edge region of the bottom 3621 of the cup 3620 along a top surface of the disk cone portion 3652 and an outer surface of the ring portion 3654. Subsequently, the liquid moves to the drain pipe 3640, and the gas moves to the exhaust pipe 3645 along the inner surface of the ring portion 3654 and the bottom surface of the disk cone portion 3652.

A liquid injection unit 3660 sprays a liquid onto the substrate W mounted on the support plate 3631. The liquid may be a treating liquid used to treat the substrate such as a photoresist liquid, an antireflection film, or a developing liquid. In some embodiments, the liquid may be a prewet liquid.

The liquid injection unit 3660 may have a guide rail 3661, a guide block 3662 driving along the guide rail 3661, a bracket 3663 provided on a side of the guide block 3662, and at least one nozzle 3664a and 3664b provided at a front end of the bracket 3663. Two nozzles 3664a and 3664b which are shown in the view are each defined as a first nozzle 3664a and a second nozzle 3664b.

The first nozzle 3664a and the second nozzle 3664b may face the treating space of the cup 3620 or may be moved away from the cup 3620 by the guide rail 3661 and the guide block 3662.

In some embodiments, if the first nozzle 3664a and the second nozzle 3664b are provided to the liquid injection unit 3660, the first nozzle 3664a may spray a treating liquid and the second nozzle 3664b may spray a rinsing liquid. The aforementioned treating liquid may be developing liquid, and the aforementioned rinsing liquid may be a pure water.

The liquid supply unit (not shown) functions to supply a liquid of a predetermined pressure to the liquid injection unit 3660. The liquid may be a treating liquid used to treat a substrate such as a photoresist liquid, an antireflection film, or a developing liquid. In some embodiments, the liquid may be a rinsing liquid.

An airflow supply unit 3670 supplies an outer airflow with an adjusted temperature and humidity to an inside of the housing 3610.

The airflow supply unit 3670 may have an airflow pipeline 3671 which provides a moving path for an airflow, a fan 3672 positioned on a ceiling of the housing 3610 and connected to a side of the airflow pipeline 3671, and a filter 3673 provided within the airflow pipeline 3671.

A first actuator 3680 is provided within the housing 3610. The first actuator 3680 has an end coupled to the cup 3620 and the other end coupled to the housing 3610 so that the cup 3620 is lifted and lowered by an electronic control.

A second actuator 3685 is provided within the housing 3610. The second actuator 3685 has an end coupled to the guide member 3650 and the other end coupled to the housing 3610 so that the guide member 3650 is lifted and lowered by an electronic control.

The controller 3695 controls the components of the substrate treating apparatus 10.

The controller 3695 controls the support plate 3631, the first nozzle 3664a, the pump 3690, and the valve 3691 to make an exhaust pressure provided in the treating space while a liquid layer of a supplied treating liquid reacts with a thin film of the substrate W lower than an exhaust pressure provided in the treating space while the treating liquid is being supplied, and here the treating liquid is supplied by the first nozzle 3664a to the substrate W mounted on the support plate 3631.

In some embodiments, the exhaust pressure provided to the treating space may be zero while the liquid film of the treating liquid supplied on the substrate W mounted on the support plate 3631 by the first nozzle 3664a reacts with the thin film of the substrate W.

Figure 9:
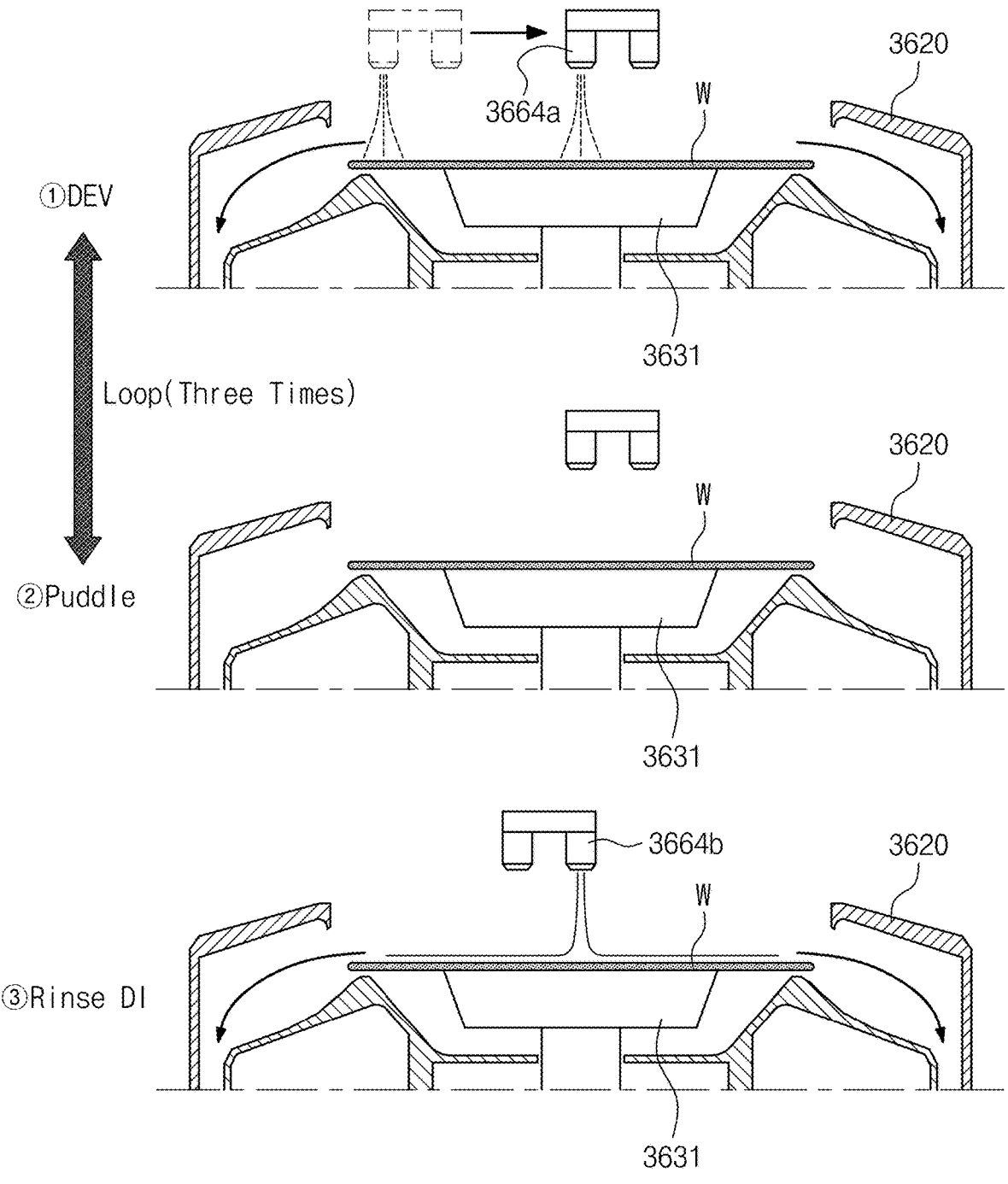
FIG. 9 schematically illustrates important processes of the substrate treating method according to an embodiment.

FIG. 8 is a flowchart of a substrate treating method according to an embodiment, and FIG. 9 schematically illustrates important processes of the substrate treating method.

Referring to FIG. 8 and FIG. 9, the substrate treating method S100 may include a substrate taking-in process S110, a liquid film forming process S120, a puddle process S130, a rinsing process S140, and a drying process S150.

In the substrate taking-in process S110, the substrate W is taken into the treating space of the cup 3620 provided in the housing 3610 from the outside of the housing 3610. The substrate W taken into the treating space is mounted on the support plate 3631 of the substrate support unit 3630.

In the liquid film forming process S120, the treating liquid is supplied from the first nozzle 3664a on the substrate W rotated by the support plate 3631, and a liquid film is formed on the substrate W. The treating liquid may be a developing liquid, and the substrate W may be provided to rotate at a speed of about 30 rpm or less. In addition, the treating liquid may be supplied while a supply position is changed from an edge region of the substrate W to a central region.

In the puddle process S130, a supply of the treating liquid of the first nozzle 3664a is stopped, and the thin film and the liquid film of the treating liquid on the substrate W react for a predetermined time. An exhaust pressure provided to the treating space during the puddle process S130 is set to be lower than an exhaust pressure provided to the treating space during the liquid film forming process S120. The exhaust pressure of the treating space may be adjusted by the pump 3690 and the valve 3691 interlocking with the exhaust pipe 3645, and the exhaust pressure provided to the treating space during the puddle process S130 may be zero. In the puddle process S130, the substrate W may be provided to be stopped or rotated at a speed of about 30 rpm or less.

In some embodiments, the liquid film forming process S120 and the puddle process S130 may be repeated N times (N≥2). N is a positive integer, and N is in the range of 2≤N≤5. N may be 3. In the rinsing process S140, a rinsing liquid is supplied on the substrate W on which the puddle process S130 is completed through the second nozzle 3664b. The rinsing liquid may be pure water. An exhaust pressure provided to the treating space during the rinsing process S140 may be set to be higher than an exhaust pressure provided to the treating space during the puddle process S130.

In the drying process S150, the substrate W on which rinsing process S140 is completed is dried.

The substrate treating method S100 solves a problem in that a local treatment (e.g., developing treatment) is not performed on a front edge of the substrate W during the puddle process S130 after the liquid film forming process S120 by controlling the exhaust pressure of the treating space.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate treating method, comprising:
positioning a substrate in a treating space;
rotating the substrate;
forming a liquid film of a treating liquid on the substrate by supplying the treating liquid onto the substrate during the rotating;
puddling the substrate, the puddling including ceasing the supplying of the treating liquid and reacting a thin film of the substrate with the liquid film on the substrate; and
applying a constant exhaust pressure to the treating space where a first exhaust pressure during the puddling is lower than a second exhaust pressure during the forming.

2. The method of claim 1, wherein the applying applies such that the first exhaust pressure is zero.

14

3. The method of claim 1, further comprising:
rinsing the substrate, the rinsing including supplying a rinsing liquid to the substrate following the puddling, and
wherein the applying applies such that a third exhaust pressure is provided during the rinsing, the third exhaust pressure being higher than the first exhaust pressure.

4. The method of claim 1, wherein the supplying supplies the treating liquid to the substrate while changing a supply position from an edge region of the substrate to a central region of the substrate.

5. The method of claim 1, wherein the forming and the puddling are repeated N (N≥2) times.

6. The method of claim 5, wherein N is in a range of 2≤N≤5.

7. The method of claim 1, wherein the treating liquid is a developing liquid.

8. The method of claim 3, wherein the rinsing liquid is pure water.

9. The method of claim 3, further comprising:
drying the substrate following the rinsing.

10. The method of claim 1, wherein the rotating rotates the substrate at a speed of about 30 rpm or less during the forming.

11. The method of claim 1, wherein the rotating rotates the substrate at a speed of about 30 rpm or less, or does not rotate, during the puddling.

12. A substrate treating method, comprising:
positioning a substrate in a treating space;
rotating the substrate;
forming a liquid film of a developing liquid on the substrate by supplying the developing liquid onto the substrate during the rotating; and
puddling the substrate, the puddling including ceasing the supplying of the developing liquid and reacting a thin film of the substrate with the liquid film of the developing liquid; and
applying a constant exhaust pressure to the treating space where a first exhaust pressure during the puddling is lower than a second exhaust pressure during the forming, and
the forming and the puddling are repeated three times.

13. The method of claim 12, wherein the first exhaust pressure is zero.

14. The method of claim 12, further comprising:
rinsing including supplying a rinsing liquid to the substrate following the puddling, and
wherein the applying applies such that a third exhaust pressure during the rinsing is higher than the first exhaust pressure during the puddling.

15. The method of claim 1, further comprising:
rinsing the substrate, the rinsing including supplying a rinsing liquid to the substrate following the puddling,
wherein the substrate does not rotate during the puddling,
wherein the applying applies such that a third exhaust pressure is provided during the rinsing, the third exhaust pressure being higher than the first exhaust pressure, the first exhaust pressure being zero.

* * * * *